(12) United States Patent
Midya et al.

(10) Patent No.: US 6,665,338 B1
(45) Date of Patent: Dec. 16, 2003

(54) CIRCUITRY FOR CONVERTING A SAMPLED DIGITAL SIGNAL TO A NATURALLY SAMPLED DIGITAL SIGNAL AND METHOD THEREFOR

(75) Inventors: Pallab Midya, Schaumburg, IL (US); Patrick L. Rakers, Kildeer, IL (US); William J. Roeckner, Carpentersville, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/478,024

(22) Filed: Jan. 5, 2000

(51) Int. Cl.[7] .............................. H03K 9/08; H03M 5/00
(52) U.S. Cl. ......................................... 375/238; 341/200
(58) Field of Search ................... 375/238; 341/138–155, 341/143

(56) References Cited

U.S. PATENT DOCUMENTS 6,031,481 A * 2/2000 Craven ..................... 341/200
6,098,046 A * 8/2000 Cooper et al. ............ 704/503
6,232,899 B1 * 5/2001 Craven ..................... 341/126
6,359,576 B1 * 3/2002 Petrofsky .................. 341/143

* cited by examiner

Primary Examiner—Stephen Chin
Assistant Examiner—Lawrence Williams
(74) Attorney, Agent, or Firm—Joanna G. Chiu; Susan C. Hill

(57) ABSTRACT

Embodiments of the present invention deal generally with circuitry and methods for converting a sampled digital signal (32) to a naturally sampled digital signal (34). One embodiment relating to a method includes receiving the sampled digital signal, calculating a duty ratio estimate (33) using feedback (52), and using interpolation (62) to determine the naturally sampled digital signal. Circuitry for converting a sampled digital signal (32) to a naturally sampled digital signal (34) includes a natural sampler, where the natural sampler includes an input to receive the sampled digital signal (32) and an input to receive a feedback signal (52). The natural sampler has an output to provide the naturally sampled digital signal (34). In one embodiment, the natural sampler calculates a duty ratio (33) using the feedback signal (52) and uses interpolation to determine the naturally sampled digital signal (34).

24 Claims, 6 Drawing Sheets

CIRCUITRY FOR CONVERTING A SAMPLED DIGITAL SIGNAL TO A NATURALLY SAMPLED DIGITAL SIGNAL AND METHOD THEREFOR

RELATED APPLICATION

This is related to Midya et al., Ser. No. 09/477,985, entitled "Switching Circuit and Method Therefor," and Midya et al., Ser. No. 09/478,013, entitled "Apparatus for Noise Shaping a Pulse Width Modulation (PWM) Signal and Method Therefor," both filed on even date herewith, and are incorporated herein by reference.

This is also related to U.S. patent application Ser. No. 09/307,453, filed May 7, 1999, and entitled "Method and Apparatus for Producing a Pulse Width Modulated Signal" and is incorporated herein by reference and assigned to the current assignee hereof.

FIELD OF THE INVENTION

This invention relates generally to digital amplifiers, and more specifically to converting a sampled digital signal to a naturally sampled digital signal.

RELATED ART

Pulse-width modulation (PWM) is widely used in a variety of applications such as digital audio amplifiers and control applications including motor controllers. Many of these applications convert a sampled digital signal to a pulse-width modulation signal in order to obtain high efficiency and high accuracy. However, as accuracy increases, so does the amount and complexity of the computations required to perform the signal conversion. A uniformly sampled PWM signal requires less computation but has distortion and no linearity. On the other hand, while more complicated to compute, a naturally sampled PWM signal maintains both linearity and signal integrity. Therefore, a need exists for a computationally efficient method for converting a uniformly sampled signal to a naturally sampled signal which may then be used to produce a naturally sampled PWM signal.

BRIEF DESCRIPTION OF THE DRAWINGS

The present invention is illustrated by way of example and not limitation in the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

As used herein, the term "bus" is used to refer to a plurality of signals or conductors which may be used to transfer one or more various types of information, such as data, addresses, control, or status. The terms "assert" and "negate" are used when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Figure 1:
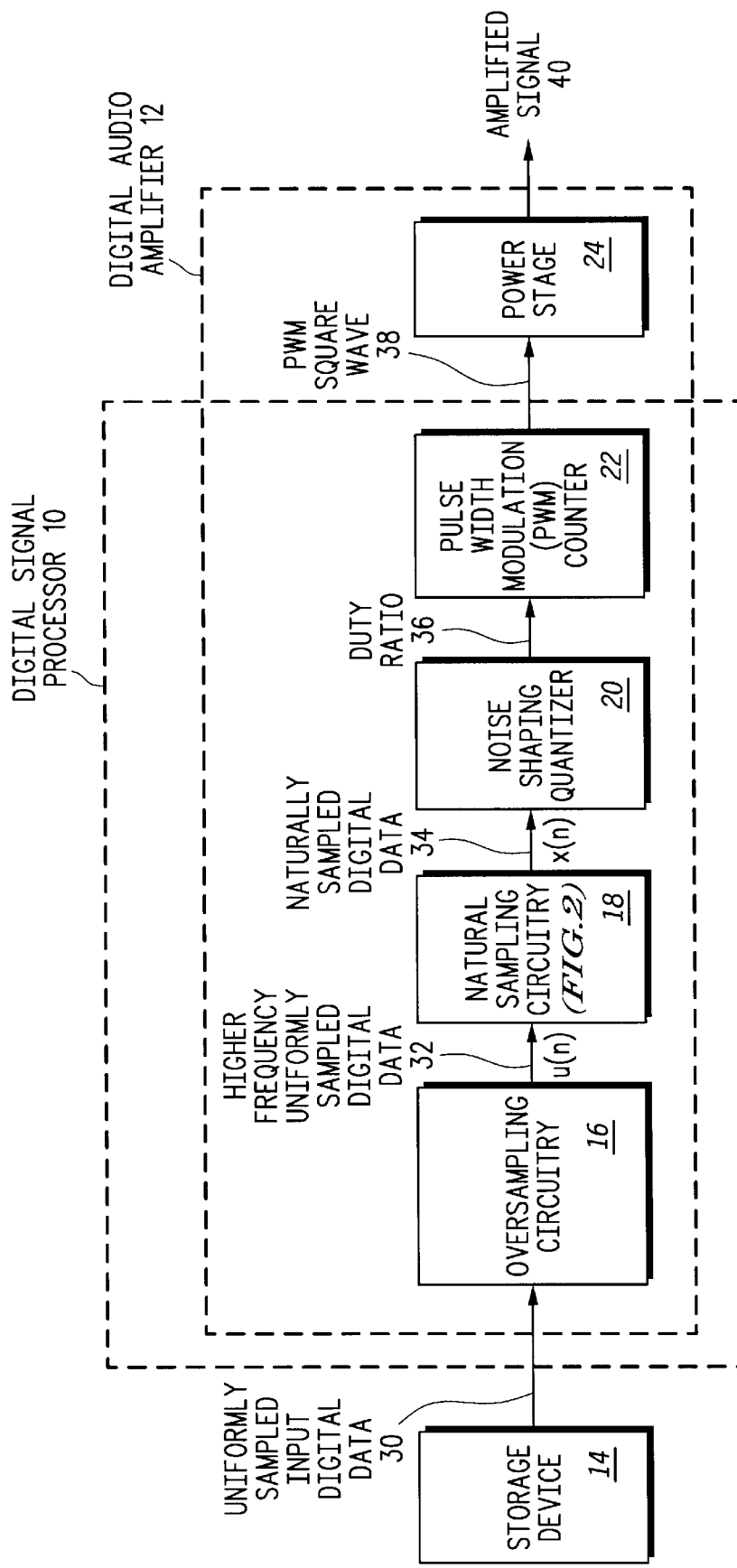
FIG. 1 illustrates a digital signal processor and a digital audio amplifier in accordance with one embodiment of the present invention.

FIG. 1 illustrates digital signal processor 10 and digital audio amplifier 12 in accordance with one embodiment of the present invention. Digital signal processor 10 includes oversampling circuitry 16, natural sampling circuitry 18, noise shaping quantizer 20, and pulse-width modulation (PWM) counter 22. Digital audio amplifier 12 includes oversampling circuitry 16, natural sampling circuitry 18, noise shaping quantizer 20, pulse-width modulation counter 22, and power stage 24. Storage device 14 provides uniformly sampled input digital data 30 to oversampling circuitry 16. Oversampling circuit 16 provides higher frequency uniformly sampled digital data 32, also referred to as u(n), to natural sampling circuitry 18, which will be further described in reference to FIG. 2. Natural sampling circuitry 18 provides naturally sampled digital data 34, also referred to as x(n), to noise shaping quantizer 20, which in turn provides a duty ratio 36 to pulse width modulation (PWM) counter 22. PWM counter 22 provides a PWM square wave 38 to power stage 24, which in turn outputs amplified signal 40.

In operation, storage device 14 contains a uniformly sampled input digital signal 30. Storage device 14 can include such devices as a compact disc (CD) or digital audio tape. Storage device 14 may also be used to broadcast digital data to a receiver for inputting into digital signal processor 10. This uniformly sampled input digital data 30 includes a stream of values which may include an audio signal. For example, CD data has a 16-bit resolution signal sampled at a 44.1 kilohertz frequency. This uniformly sampled input digital data 30 is then converted to a higher frequency uniformly sampled digital data 32 by oversampling circuitry 16. Effectively, oversampling circuitry 16 is a data rate converter where data comes in at one rate and is output at a different rate. In one embodiment of the present invention, oversampling circuitry 16 receives uniformly sampled input digital data 30 and samples it at a rate eight times greater to produce the higher frequency uniformly sampled digital data 32. For example, in the case of the CD where uniformly sampled input digital data 30 is sampled at a rate of 44.1 kilohertz, oversampling circuitry 16 would sample this signal at a higher frequency of 352.8 kilohertz to produce the higher frequency uniformly sampled digital data 32, which corresponds to signal u(n). Natural sampling circuitry 18 then converts the uniformly sampled digital data signal u(n) into a naturally sampled digital data signal x(n). Operation of natural sampling circuitry 18 will be discussed below in reference to FIG. 2.

Noise shaping quantizer 20, quantizes the naturally sampled digital data signal x(n) in order to produce a lower resolution signal such that the noise in the frequency band of interest is limited. Therefore, noise shaping quantizer 20 converts naturally sampled digital data 34 into duty ratio 36. This duty ratio 36 is then used by PWM counter 22 to produce PWM square wave 38. The PWM square wave 38 at the output of PWM counter 22 is amplified by power stage 24 to produce amplified signal 40 at the output of digital audio amplifier 12.

Note that FIG. 1 illustrates the use of uniformly sampled input digital data signals. However, other embodiments of the present invention may use sampled digital signals that are not uniformly sampled. For example, the frequency may vary over the range of the input digital data. Also, while FIG. 1 illustrates a digital audio amplifier, other embodiments may use other types of digital amplifiers, depending on the application, and are not limited to digital audio amplifiers.

Figure 2:
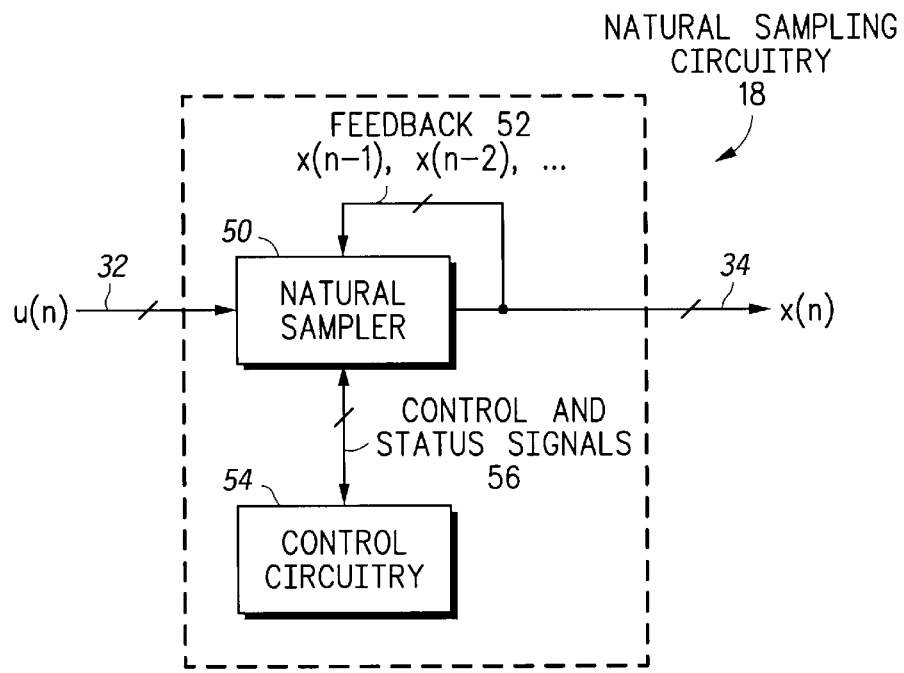
FIG. 2 illustrates one embodiment of the natural sampling circuitry of FIG. 1.

FIG. 2 illustrates natural sampling circuitry 18 of FIG. 1. Natural sampler 50 receives u(n) and outputs signal x(n). Natural sampler 50 also receives feedback 52 taken from the output x(n). Feedback 52 therefore refers to the previous values of output x(n), such as x(n−1), x(n−2), etc. These prior or past values can be stored in control circuitry 54, or alternatively, feedback 52 may include latches or other storage devices for storing the past values. Non-linear systems with feedback, such as natural sampling circuitry 18, introduce the possibility of instability into the system. In linear systems with feedback, if the system is stable at one input then it is guaranteed stable at all inputs. However, in a non-linear system with feedback, if the system is stable at one input, it is not guaranteed to be stable at other inputs. Therefore, design of such non-linear systems with feedback is more difficult. The equations relating to linear systems are easier to resolve and are more likely to provide a stable system. Furthermore, it is less complicated to guarantee stability and convergence in a linear system than a non-linear system with feedback. However, improved accuracy is achieved with non-linear systems, therefore, a need exists for stable non-linear systems with feedback, such as natural sampling circuitry 18.

Figure 3:
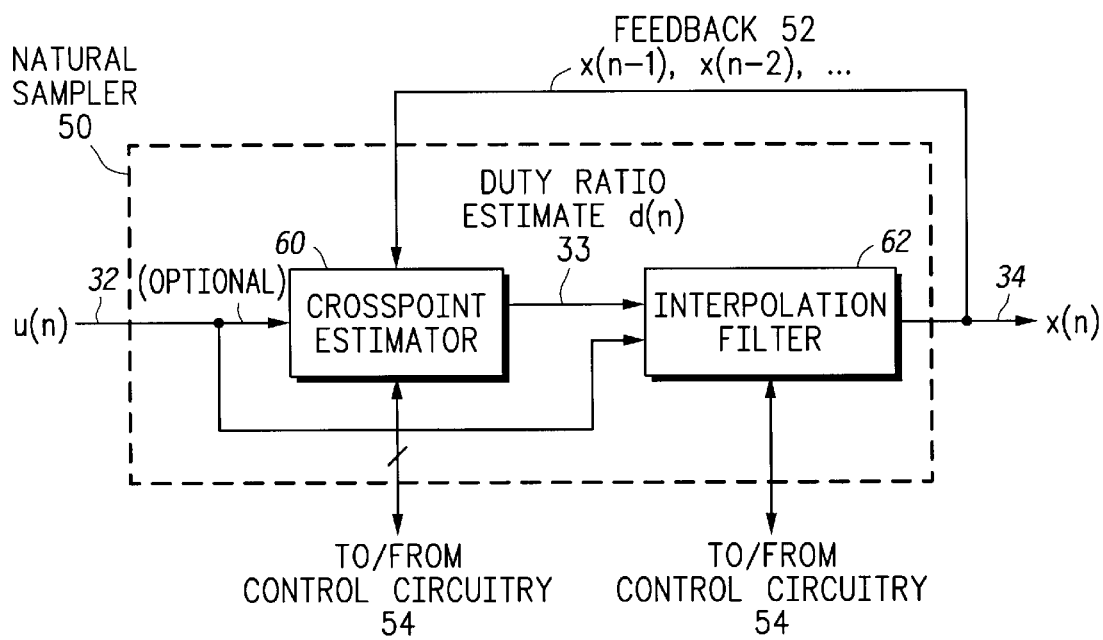
FIG. 3 illustrates one embodiment of the natural sampler of FIG. 2.

FIG. 3 illustrates natural sampler 50 of FIG. 2. Natural sampler 50 includes crosspoint estimator 60 and interpolation filter 62. Crosspoint estimator 60 optionally receives input signal u(n) as well as feedback 52 taken from output x(n). Crosspoint estimator 60 provides duty ratio estimate 33, d(n), to interpolation filter 62. Interpolation filter 62 also receives input u(n) and provides the output x(n). Crosspoint estimator 60 and interpolation filter 62 are both coupled to control circuitry 54 in order to receive past values of u(n) and/or x(n) and to receive future values of u(n). Operation of natural sampling circuitry 18, including natural sampler 50, will be discussed further below, in reference to FIGS. 4 and 5.

Figure 4:
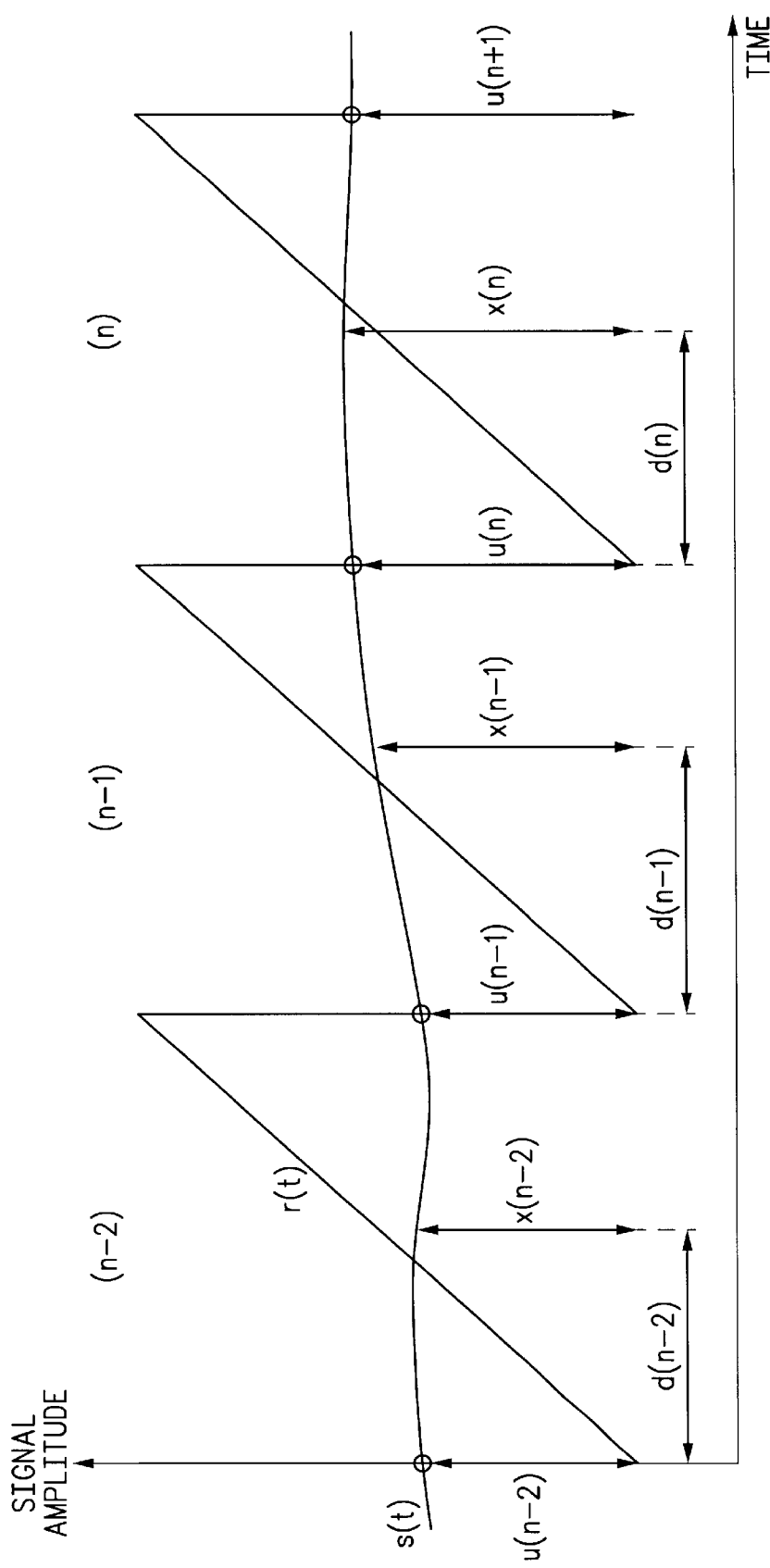
FIG. 4 illustrates in graph form the signals related to the cross point estimator of FIG. 3.

Natural sampling of an input signal is associated with a linear ramp at the switching frequency. This linear ramp corresponds to the signal labeled r(t) of FIG. 4, where the amplitude has been normalized from 0 to 1 and the time cycle has been normalized from 0 to 1. (Although r(t) in FIG. 4 represents a normalized linear ramp for easier computation, the ramp need not be normalized in other embodiments.) Signal s(t) of FIG. 4 corresponds to the continuous analog time representation of the input digital signal u(n). In each cycle, there is a duty ratio estimate d(n) calculated as shown in equation 1 below. The x values shown in FIG. 4 correspond to the data values of signal s(t) at the duty ratio time points. The ideal values of the duty ratio estimates d(n) would correspond to the point at which the ramp signal r(t) intersects the input signal s(t). At this crosspoint for each cycle, the value d(n) should equal x(n) due to the right triangle properties of the ramp signal r(t). However, these exact crosspoints are unknown and the only information available to the system at this point are present and past values of x and present, past, and future values of u. Therefore, d(n) is estimated based at least upon past values of x. One embodiment of the present invention uses the following equation (equation 1) to determine d(n).

$$d(n) = a_1 x(n-1)$$
$$+ a_2 x(n-2) +$$
$$a_3 x(n-3) +$$
$$a_4 x(n-4) +$$
$$b_0 u(n) + b_1 u(n-1)$$
$$+ b_2 u(n-2) + b_3 u$$
$$(n-3) + b_4 u(n-4) +$$
$$b_{-1} u(n+1) + b$$
$$_{-2} u(n+2) + b_{-3} u(n+3)$$
$$+ b_{-4} u(n+4) \qquad \text{Equation 1}$$

In the above equation, $a_1$ through $a_4$, $b_0$ through $b_4$, and $b_{-1}$ through $b_{-4}$ each correspond to some constant value. Value x(n−1) corresponds to the previous value of x, and x(n−2) corresponds to the value of x two cycles ago, etc. Therefore, x(n−4) corresponds to the value of x four cycles ago. Likewise u(n) corresponds to the current value of u, while u(n−2) corresponds to the value of u two cycles ago. Furthermore, u(n+1) corresponds to the future value of u, one cycle later. These future values are available from storage media 14 directly and can be obtained through oversampling circuitry 16 from storage device 14. These can be accessed as needed (which may introduce a lag resulting from retrieving the data as needed each cycle) or prefetched from storage device 14 and stored until needed in control circuitry 54 or any other storage device within the system.

The equation for d(n) may or may not include the terms corresponding to the input u. However, these additional terms, while increasing computational complexity, help improve accuracy. The values corresponding to the interpolated signal x represent the feedback values received by crosspoint estimator 60 to produce duty ratio estimate d(n). Feedback path 52 may therefore include latches or any other type of storage circuitry that may be used to temporarily store prior values of x.

Interpolation filter 62 uses the estimates d(n) to compute a corresponding value of s(t) at the estimated crosspoint. However, due to the fact that d(n) is simply an estimate of the anticipated crosspoint, an error is introduced in this calculation. Referring to d(n) of FIG. 4, the value x(n) occurs a little before the intersection of s(t) and r(t). This is due to the estimation of the duty ratio d(n). In order to obtain the value of x(n), interpolation filter 62 interpolates the current value at x(n) based upon surrounding uniform sample data points such as u(n), u(n−1), and/or u(n+1). Depending on the complexity of the interpolation filter, fewer or more surrounding points may be used. The interpolation can be performed by a variety of methods known in the art such as a finite input response filter, or a finite input response filter with correction for truncation errors, or by any other polynomial interpolation function. Therefore, interpolation filter 62 may include circuitry to perform any of these functions. Furthermore, the interpolation may be repeated in order to improve accuracy of the interpolated x(n) value.

Figure 5:
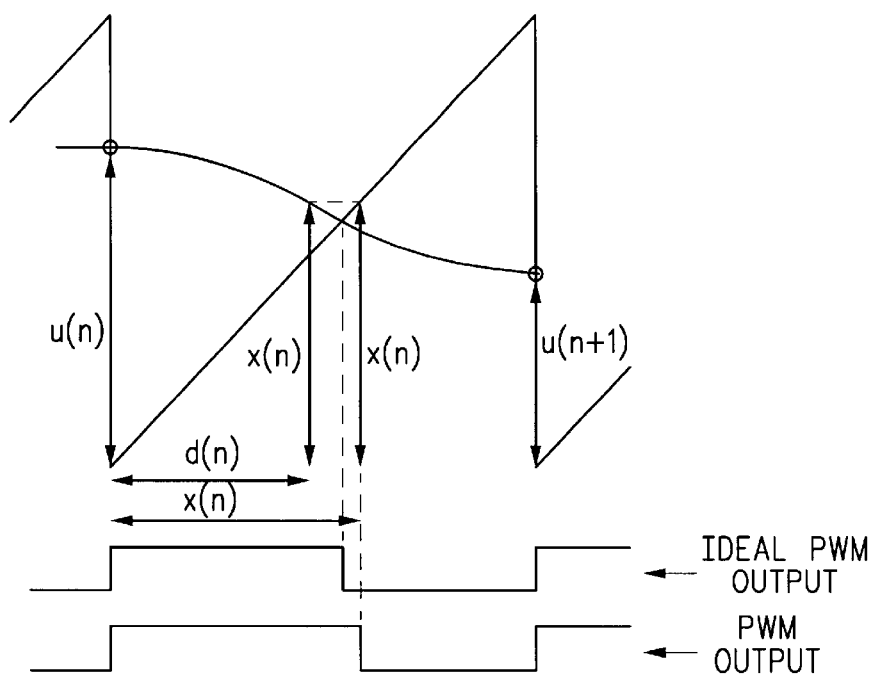
FIG. 5 illustrates a portion of the graph of FIG. 4 to illustrate the approximation of the cross point estimator.

FIG. 5 illustrates a zoomed in portion of the graph of FIG. 4. FIG. 5 illustrates the cycle between u(n) and u(n+1). The duty cycle estimate d(n) calculated by crosspoint estimator 60, using the feedback as described above, corresponds to the interpolated value x(n) which is calculated by interpolation filter 62. Ideally, d(n) should correspond to the exact crosspoint of ramp signal r(t) and input signal s(t). However, since d(n) is simply an estimated calculation based on past, present, and future values, the interpolated value of x(n) is not exactly at this crosspoint, as seen in FIG. 5. The PWM output signal (PWM square wave 38) that is generated from x(n) is high for a period equivalent to x(n). This PWM output varies slightly from the ideal PWM output which would be high for a period from the beginning of the cycle to the point at which input signal s(t) intersects ramp r(t).

In one embodiment of the present application, the estimation equation for d(n) may include only feedback values as shown in the following equation (equation 2).

$$d(n)=a_1x(n-1)+a_2x(n-2)+a_3x(n-3)+a_4x(n-4) \quad \text{Equation 2}$$

Equation 2 includes four terms with four corresponding constants, through $a_4$. These constants are chosen in order to minimize the distortion at the frequencies of interest. The frequency of interest for a certain application depends on that particular application's needs. For example, in audio applications the frequency of interest would fall below 20 kilohertz. The frequencies above 20 kilohertz would not be of interest since these fall beyond the range of human hearing. At lower frequencies, the sensitivity of human hearing increases, therefore, the constants are chosen to minimize distortion of these lower frequencies. Therefore, one embodiment of the present invention minimizes distortion at the lowest frequencies for audio applications by selecting constants that improve the accuracy of the duty ratio estimate at selected frequencies based on human hearing.

Other embodiments may include different frequencies of interest. For example, if the target frequency for optimization is 3 kilohertz, meaning harmonics are minimized at 3 kilohertz, more distortion harmonics will be introduced at frequencies lower and higher than 3 kilohertz. Likewise, if equation 2 includes more terms or less terms, a corresponding constant would be determined for each term. These constants would be selected in order to improve the accuracy of the duty ratio estimate at the frequencies of interest for the particular application.

Equation 2, as described above, includes four terms, thus corresponding to a fourth order equation. Depending on the application, duty ratio estimate d(n) may be a first order equation, a second order equation, a fifth order equation, etc. As the order of the equation increases so does the accuracy of the estimated duty ratio signal. However, as the order increases so does the complexity of the computations required to calculate the duty ratio each cycle. Therefore, the order of the equation is designed to be the minimum possible while still meeting the target distortion numbers. For example, in one embodiment of the present invention, duty ratio estimate d(n) is a fourth order equation which meets the distortion requirements for a CD audio signal. Therefore, a lower order equation results in reduced million-instructions per second (MIPS) in a software system or reduced hardware complexity in a hardware system.

Equations 3 through 6 illustrate the constants chosen to minimize distortions at various frequencies for different order equations of the duty ratio estimate d(n).

$$d(n)=x(n-1) \quad \text{Equation 3}$$

$$d(n)=2x(n-1)-x(n-2) \quad \text{Equation 4}$$

$$d(n)=3x(n-1)-3x(n-2)+x(n-3) \quad \text{Equation 5}$$

$$d(n)=4x(n-1)-6x(n-2)+4x(n-3)-x(n-4) \quad \text{Equation 6}$$

For example, the first order (equation 3) assumes that the current value of d(n) is equivalent to the previous value of x(n), which is x(n-1). Once again, this is based upon the triangular relationship defined by the ramp r(t), where it is assumed for any given triangle d(n) is equal to x(n). The first order equation takes into account only the previous value of x and estimates that the current value of d is equal to this previous value of x. Equation 4, on the other hand, is a second order equation which takes into account not only the previous value of x, but the first derivative as well. That is, equation 4 takes into account the slope of the previous change from data point x(n-2) to x(n-1) when estimating the current value of d(n). Therefore, equation 4 uses two prior values of x. Likewise, equation 5 uses not only the first derivative information, but second derivative information as well in order to estimate the current value of d(n). That is, equation 5 utilizes the 3 previous values of x in order to estimate the current value of d(n). Likewise, equation 6 takes into consideration the first, second, and third derivatives by using information from the previous 4 values of x to determine the current value of d(n). Thus, as the order of the equation increases, so does the accuracy of the estimation. However, as mentioned above, the computational complexity also increases as the order increases.

Equations 3 through 6 for duty ratio estimate d(n) can be rewritten in the z-domain by the following equation:

$$D=HX \quad \text{Equation 7}$$

In the z-domain, $z^{-1}$ refers to the delay of one cycle, which is illustrated in the time domain by the previous input of x(n), i.e. x(n-1). Therefore, for a first order equation of the duty ratio estimate of equation 3, the z-domain equation would be: $D=z^{-1}X$. In equation 7, D represents the value of the duty ratio estimate signal in the z-domain, and X represents the value of the naturally sampled input signal in the z-domain. H(z) refers to the transfer function in the z-domain. For equations 3–6, H(z) is defined as follows in equation 8, where m refers to the order of the equation:

$$H(z)=1-(1-z^{-1})^m \quad \text{Equation 8}$$

In order to improve accuracy of the duty ratio estimate signal d(n), crosspoint estimator 60 may further use the past, present, and future values of the input signal u(n). For example, equation 9 below illustrates, in the time domain, duty ratio estimate signal d(n) in the $4^{th}$ order using both past and present values of the input signal u(n) and past feedback values of x(n). Once again, the constants have been chosen to minimize distortion in the duty ratio estimate signal. Other embodiments may also include future values of the input value u(n) in order to determine duty ratio estimate d(n). Note that equation 9 is in a format similar to that of equation 1 where the coefficients $b_{-1}$ through $b_{-4}$ are 0.

$$d(n)=u(n)+4(x(n-1)-u(n-1))-6(x(n-2)-u(n-2))-4(x(n-3)-u(n-3))+(x(n-4)-u(n-4)) \quad \text{Equation 9}$$

Equation 10 below illustrates the z-domain representation of equation 9. Note that the D signal is calculated from the input signal U and a feedback value illustrated by the second term of the equation.

$$D=U+\{1-(1-z^{-1})^m\}(X-U) \quad \text{Equation 10}$$

In other embodiments of the present invention, different constants and/or different values may be chosen, which would correspond to a different z-domain transfer function. The constants, order of the equation, and the terms used in addition to the feedback terms may vary depending on the application and/or the data processing system.

Figure 6:
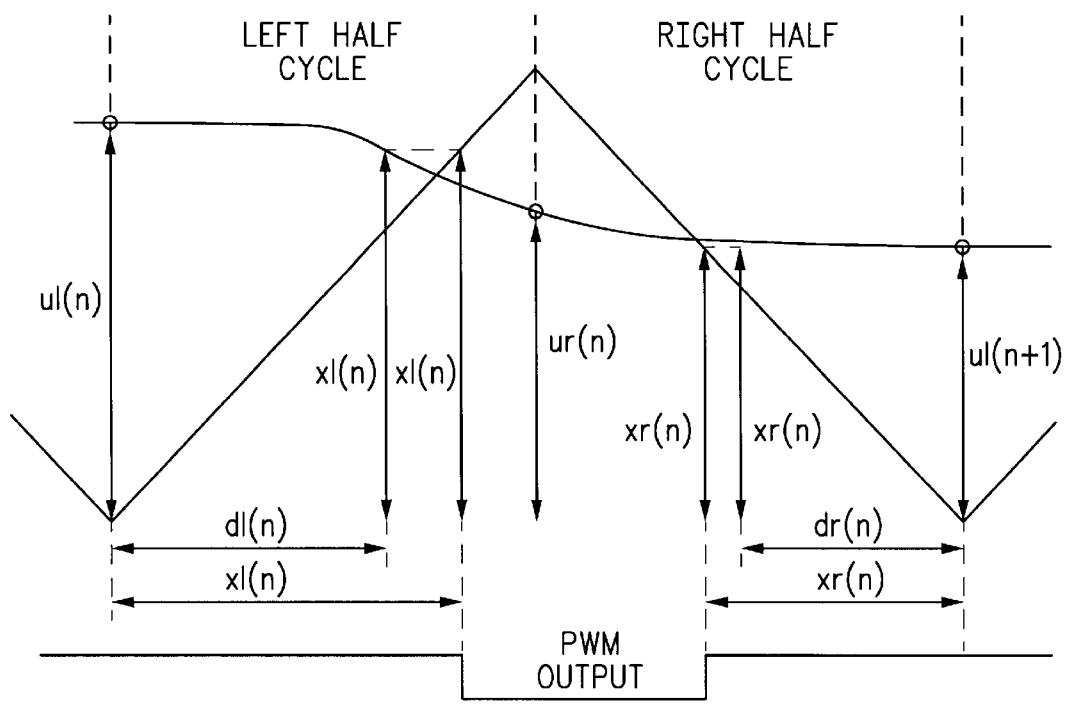
FIG. 6 illustrates one embodiment of cross point estimator 60 corresponding to a two-sided PWM.

FIG. 6 illustrates a method to generate a two-sided pulse with modulation output signal incorporating the methods of FIG. 5. The cycle time between ul(n) and ul(n+1) is equivalent to the cycle time between u(n) and u(n+1) of FIG. 5. Note that for each cycle in the case of FIG. 6, two sets of calculations need to be performed, one for the left half of the cycle and one for the right half of the cycle. In this manner both edges of the pulse width modulation output signal are based on the input signal s(t). This allows for greater accuracy yet requires a greater number of computations. Value dl(n) corresponds to the duty cycle estimation of the left hand side of the cycle, and is based on the outputs corresponding to the left hand of the cycle. Likewise, dr(n) refers to the duty cycle estimation of the right half of the cycle and is based on the past outputs corresponding to the right half of the cycle. These duty cycle estimates for the right and left half of the cycle can be written in the z-domain as shown in equations 11 and 12 below where DL and XL correspond to the left side of each cycle and DR and XR correspond to the right side of each cycle.

$$DL=HXL \quad \text{Equation 11}$$

$$DR=HXR \quad \text{Equation 12}$$

The methods described above in reference to the one-sided pulse width modulation output each apply to the method of FIG. 6 illustrating a two-sided pulse width modulation output. That is, the calculations are analogous to those described above. In the case of the two-sided PWM, the PWM output signal is high for a period equivalent to xr(n)+xl(n).

Figure 7:
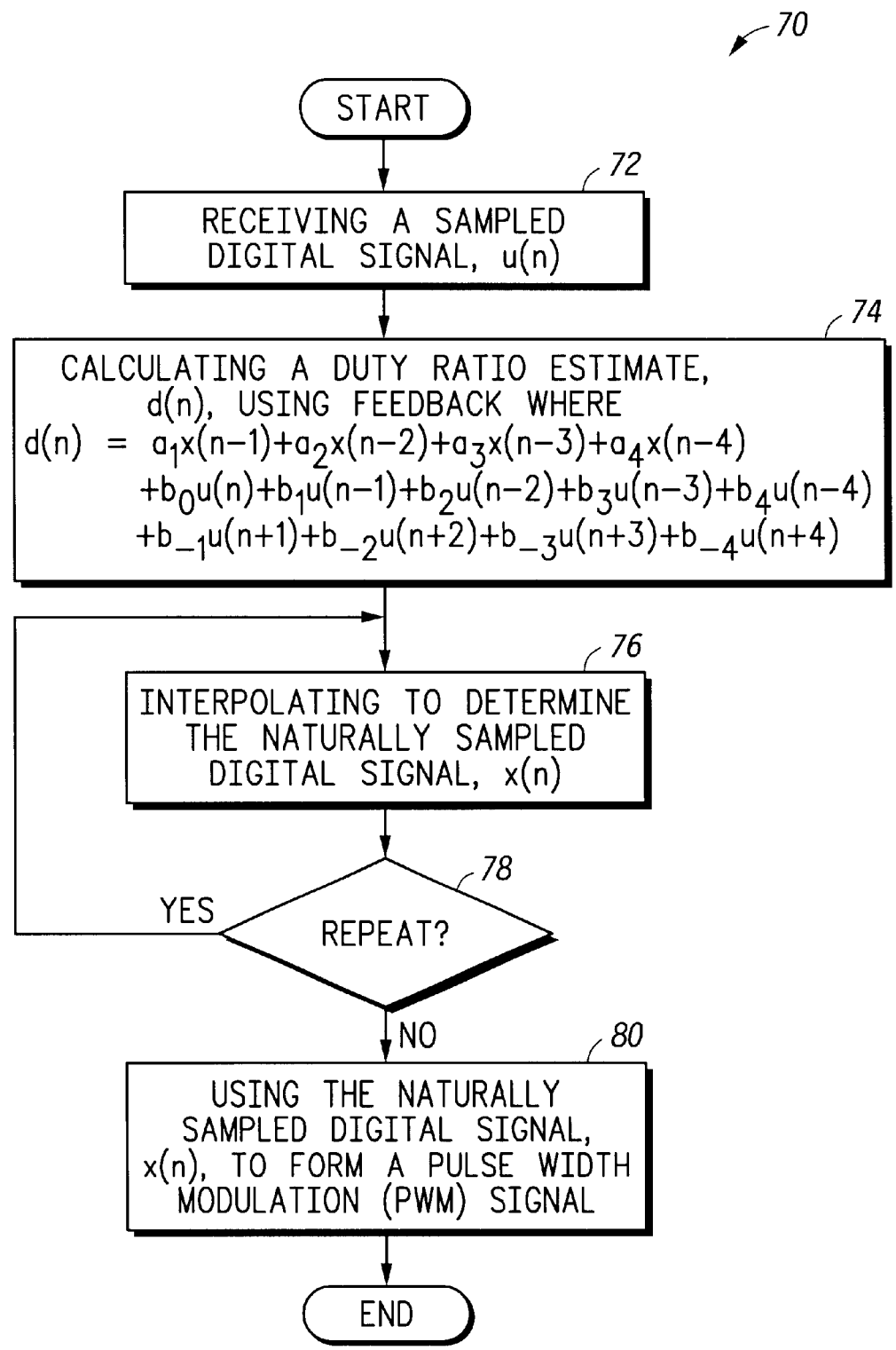
FIG. 7 illustrates in block diagram form a data processing system in accordance with one embodiment of the present invention.

FIG. 7 illustrates, in flow diagram form, one embodiment of the present invention which illustrates a method of converting a sampled digital signal to a naturally sampled digital signal. Flow 70 begins with receiving a sampled digital signal, u(n), in block 72. A duty ratio estimate, d(n), is then calculated using feedback in block 74. The equation shown in block 74 for d(n) is equation 1 that was described above. Next, in block 76, interpolation is used to determine the naturally sampled digital signal, x(n). As illustrated by decision diamond 78, this interpolation may be repeated in order to improve the accuracy of x(n); however, this repetition of block 76 is optional. Once the interpolation is complete and x(n) has been determined, the naturally sampled digital signal is used to form a pulse width modulation (PWM) signal.

Figure 8:
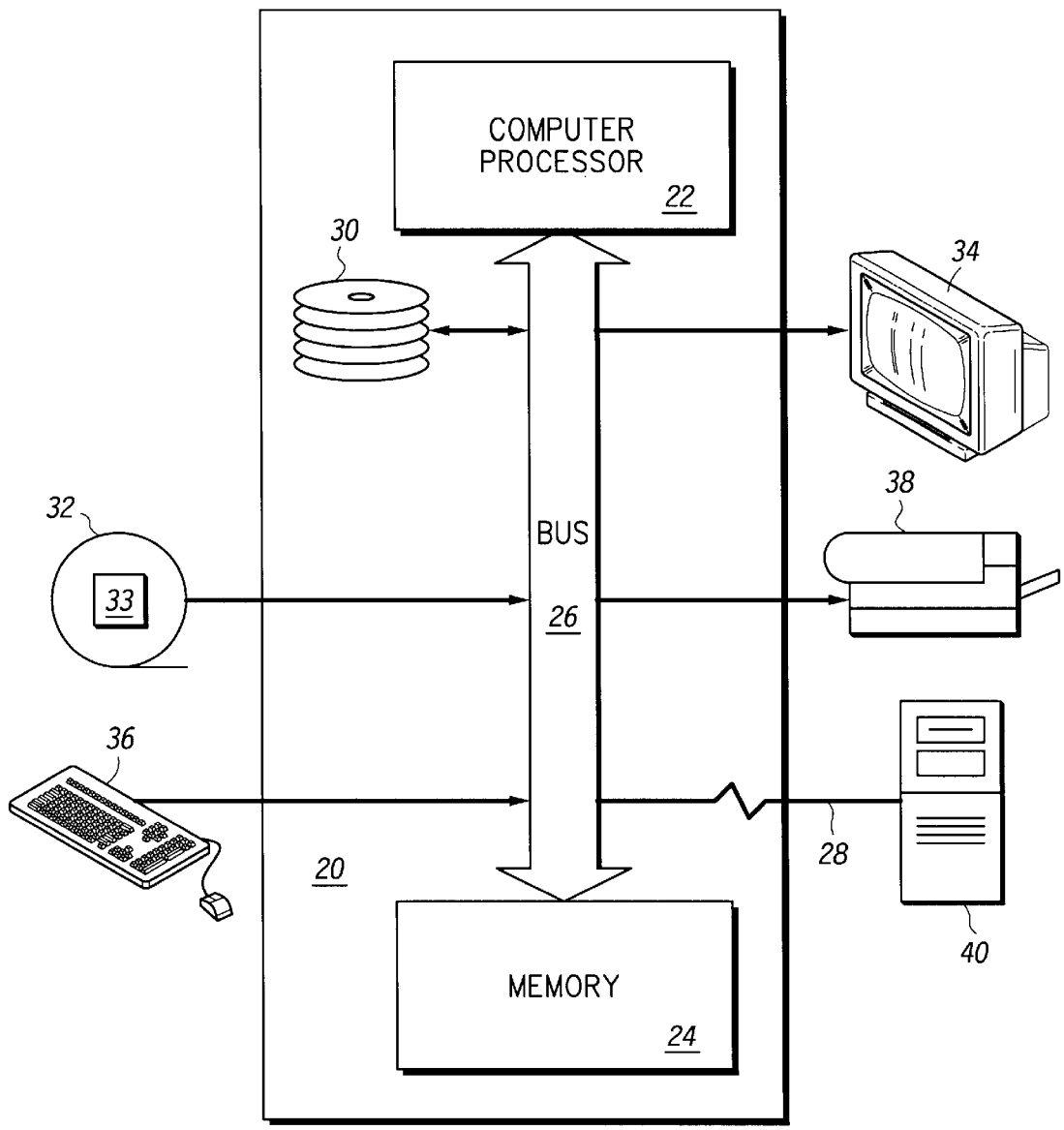
FIG. 8 is a block diagram illustrating a general purpose computer used to implement one embodiment of the present invention.

FIG. 8 is a block diagram illustrating a General Purpose Computer 20 used to implement one embodiment of the present invention. General Purpose Computer 20 includes a Computer Processor 22 and Memory 24, connected by a Bus 26. Memory 24 is a relatively high speed machine-readable medium and includes Volatile Memories such as DRAM, and SRAM, and Non-Volatile Memories such as, ROM, FLASH, EPROM, EEPROM, and bubble memory. Also connected to the Bus are Secondary Storage 30, External Storage 32, output devices such as monitor 34, input devices such as keyboard (with mouse) 36, and printers 38. Secondary Storage 30 includes machine-readable media such as hard disk drives, magnetic drum, and bubble memory.

External Storage 32 includes machine-readable media such as floppy disks, removable hard drives, magnetic tape, CD-ROM, and even other computers, possibly connected via a communications line. The distinction drawn here between Secondary Storage 30 and External Storage 32 is primarily for convenience in describing the invention. As such, it should be appreciated that there is substantial functional overlap between these elements. Computer software 33 including user programs can be stored in a Computer Software Storage Medium, such as memory 24, Secondary Storage 30, and External Storage 32. Secondary Storage 30 and Non-Volatile Memory are loaded for execution directly into Volatile Memory, executed directly out of Non-Volatile Memory, or stored in Secondary Storage 30 prior to loading into Volatile Memory for execution.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for converting a sampled digital signal to a naturally sampled digital signal, said method comprising:

receiving the sampled digital signal;

calculating a duty ratio estimate using feedback; and using interpolation to determine the naturally sampled digital signal, wherein the feedback comprises at least one value of the naturally sampled digital signal and using interpolation comprises using the duty ratio estimate and the sampled digital signal to determine the naturally sampled digital signal.

2. The method of claim 1, wherein the sampled digital signal is uniformly sampled.

3. The method of claim 1, further comprising using the naturally sampled digital signal to form a pulse width modulation (PWM) signal.

4. The method of claim 3, wherein the PWM signal is a two-sided PWM signal.

5. The method of claim 1, wherein calculating the duty ratio estimate further uses at least one prior value of the sampled digital signal.

6. The method of claim 1, wherein calculating the duty ratio estimate further uses a current value of the sampled digital signal.

7. The method of claim 1, wherein calculating the duty ratio estimate further uses at least one future value of the sampled digital signal.

8. The method of claim 1, wherein calculating the duty ratio estimate further uses at least one prior value of the sampled digital signal, a current value of the sampled digital signal, and at least one future value of the sampled digital signal.

9. The method of claim 1, wherein using interpolation comprises using a finite impulse response (FIR) filter.

10. The method of claim 9, wherein using interpolation further comprises using correction for truncation error.

11. The method of claim 1, wherein using interpolation further comprises using a polynomial interpolation function.

12. The method of claim 1, wherein said step of using interpolation is repeated at least once.

13. The method of claim 1, wherein the feedback comprises a plurality of naturally sampled digital signals.

14. The method of claim 1, wherein said step of calculating the duty ratio estimate uses constants which have been selected to improve accuracy of the duty ratio estimate at predetermined frequencies.

15. The method of claim 1, wherein said method is performed by a digital signal processor.

16. The method of claim 1, wherein said method is performed by a digital amplifier.

17. The method of claim 16, wherein the digital amplifier is a digital audio amplifier.

18. A storage circuit for storing a plurality of binary values, wherein the plurality of binary values are used to control execution of the method of claim 1.

19. Circuitry for converting a sampled digital signal to a naturally sampled digital signal, said circuitry comprising:

a natural sampler, said natural sampler having an input to receive the sampled digital signal, having an input to receive a feedback signal, and having an output to provide the naturally sampled digital signal, wherein the natural sampler calculates a duty ratio using the feedback signal and uses interpolation to determine the naturally sampled digital signal.

20. The method of claim 18, wherein the feedback signal comprises at least one naturally sampled digital signal.

21. Circuitry as in claim 18, wherein said natural sampler comprises:

a crosspoint estimator having an input to receive the feedback signal and having an output to provide a duty ratio estimate; and interpolation circuitry having a first input coupled to the crosspoint estimator to receive the duty ratio estimate, having a second input to receive the sampled digital signal, and having an output to provide the naturally sampled digital signal.

22. Circuitry as in claim 21, wherein said crosspoint estimator has a second input to receive the sampled digital signal.

23. Circuitry as in claim 18, wherein the feedback signal includes a plurality of past naturally sampled digital signals.

24. Circuitry as in claim 23, further comprising:

control circuitry, coupled to the natural sampler for providing control signals, wherein in response to control signals from the control circuitry, the natural sampler calculates the naturally sampled digital signal using the sampled digital signal, a plurality of past sampled digital signals, a plurality of future sampled digital signals, and the feedback signal.

* * * * *

UNITED STATES PATENT AND TRADEMARK OFFICE
CERTIFICATE OF CORRECTION

PATENT NO. : 6,665,338 B1
DATED : December 16, 2003
INVENTOR(S) : Pallab Midya, Patrick L. Rakers and William J. Roeckner It is certified that error appears in the above-identified patent and that said Letters Patent is hereby corrected as shown below:

Column 10,
Lines 6, 8 and 23, change "claim 18" to -- claim 19 --

Signed and Sealed this

Twentieth Day of July, 2004

JON W. DUDAS
*Acting Director of the United States Patent and Trademark Office*